US009269752B2

(12) United States Patent  
Huang et al.

(10) Patent No.: US 9,269,752 B2  
(45) Date of Patent: Feb. 23, 2016

(54) ORGANIC ELECTROLUMINESCENCE DISPLAY

(71) Applicant: Innolux Corporation, Miao-Li County (TW)

(72) Inventors: Hao-Jung Huang, Miao-Li County (TW); Che-Wei Lin, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 14/320,715

(22) Filed: Jul. 1, 2014

(65) Prior Publication Data

US 2015/0022078 A1  Jan. 22, 2015

(30) Foreign Application Priority Data

Jul. 19, 2013  (TW) .............................. 102125978 A

(51) Int. Cl.
   *H01L 27/32*  (2006.01)
(52) U.S. Cl.
   CPC .................................. *H01L 27/3218* (2013.01)
(58) Field of Classification Search
   CPC ................. H01L 225/5315; H01L 27/3216; H01L 2924/12044; G09G 300/0439; G09G 3/3208
   USPC ................................................. 313/500–512
   See application file for complete search history.

(56) References Cited

U.S. PATENT DOCUMENTS 7,755,266 B2 * 7/2010 Tsai et al. ...................... 313/484  
8,896,200 B2 * 11/2014 Huang et al. .................. 313/504  
2006/0132668 A1 * 6/2006 Park et al. ........................ 349/48  
2007/0205423 A1 * 9/2007 Yamazaki et al. .............. 257/89  
2008/0001525 A1 * 1/2008 Chao et al. ..................... 313/500  
2011/0121346 A1 * 5/2011 Yamada et al. ................. 257/98  
2011/0260951 A1   10/2011 Hwang et al.  
2011/0291550 A1 * 12/2011 Kim et al. ...................... 313/504  
2013/0002118 A1 * 1/2013 Ko .................................... 313/1  
2014/0003045 A1 * 1/2014 Lee et al. ....................... 362/231

FOREIGN PATENT DOCUMENTS

CN   102354702 A   2/2012  
JP   2005166691 A   6/2005  
TW   I360804       3/2012

OTHER PUBLICATIONS

TW Office Action dated Jul. 27, 2015 in corresponding Taiwan application (No. 102125978).

* cited by examiner

*Primary Examiner* — Tracie Y Green  
(74) *Attorney, Agent, or Firm* — McClure, Qualey & Rodack, LLP

(57) ABSTRACT

A display includes a substrate; an electrode layer formed on the substrate and having an electrode pattern; and an organic material layer formed on the electrode layer, wherein a plurality of pixel units are configured by the combination of the electrode pattern and the organic material layer. At least one of pixel units includes plural different colored sub-pixels arranged in delta. In one embodiment, the same colored sub-pixels of adjacent pixel units are arranged in delta. In another embodiment, the same colored sub-pixels of adjacent pixel units are arranged as a stripe. According to the embodiment, an opening of the shadow mask is corresponding to at least three sub-pixels with same color when the material is evaporated through the shadow mask.

12 Claims, 6 Drawing Sheets

ORGANIC ELECTROLUMINESCENCE DISPLAY

This application claims the benefit of Taiwan application Serial No. 102125978, filed Jul. 19, 2013, the subject matter of which is incorporated herein by reference.

BACKGROUND

1. Technical Field

The disclosed embodiments relate in general to a display, and more particularly to a high resolution organic electroluminescence display (OLED).

2. Description of the Related Art

In comparison to the conventional cathode-ray tube display device, the flat panel display device, such as the liquid crystal display device (LCD), the plasma display device (PDP) and the organic electroluminescent display (OELD) device), are lighter, slimmer and compacter, and has become the mainstream product. The OELD device, in particular, has advantages of light weight, flexibility, easy to carry (portability), full color, high brightness, lower power consumption, wider viewing angle and faster response time.

Generally, there are two main classes of organic light emitting materials of organic electroluminescent display, including small-molecule based light emitting diodes (OLEDs) and polymer light emitting diodes (PLEDs). Although both classes of materials have conjugated chemical structures and high luminescent efficiencies, the differences of molecular weights thereof is huge. Organic molecules of the small-molecule based light emitting diodes (OLEDs) have low molecular weight of about couple hundreds, while organic molecules of the polymer light emitting diodes (PLEDs) have extremely high molecular weight of about ten thousands to couple millions. Also, in the fabrication of the light emitting layer of pixels, the small-molecule based light emitting diodes (OLEDs) material is generally deposited by vacuum thermal evaporation (VTE) through the shadow mask. The polymer light emitting diodes (PLEDs) material is dispersed at pixels, typically by spin coating or inkjet printing, wherein the procedures require no vacuum environment, and the processing equipment is more inexpensive. The polymer light emitting diodes (PLEDs) material is suitable for applying to the devices with large area. The PLEDs material is usually used for the applications of large sized displays. However, the small-molecule based light emitting diodes (OLEDs) material has better result of film formation, which is suitable for applying to the high-end products. The OLEDs material is usually used for the applications of medium or small sized displays.

Take three different colored sub-pixels (R, G, B sub-pixels) to exemplify the evaporation of materials capable of emitting red, green and blue light colors independently. Please refer to FIG. 1A~FIG. 1C, which illustrate an organic light emitting material evaporated in a vacuum system. The upper and lower portions in the figures depict the top views and the cross-sectional view of the substrates and the related elements on the substrates. A substrate 11 is disposed under a shadow mask 12, and the organic light emitting material 15 is then deposited on the certain areas through the shadow mask 12 by the vapor thermal evaporation (VTE). As shown in FIG. 1B, a shadow mask 12 is disposed on the substrate 11. Typically, the shadow mask is made from the metallic material with low thermal expansion coefficient, and so-called as the metal mask or the fine metal mask (FMM). The shadow mask 12 could be formed by welding a thin metal plate on a metal frame 13, wherein the thin metal plate have a predetermined pattern (such as the openings 12a arranged as an array) formed by electroforming or etching. When one of red, blue and green organic materials is deposited, the pattern of the shadow mask 12 corresponds to the positions of one colored pixels but shields the positions of other two colored pixels. For example, the openings 12a (FIG. 1B) are corresponding to the positions of red pixels, and the evaporation source 14 contains the red organic light emitting material. During evaporation, the red organic light emitting material is deposited through the openings 12a to form the organic light emitting material 15 at the red pixel areas (FIG. 1C). The shadow mask 12 or the substrate is then moved by a high accuracy alignment system to deposit another colored light emitting material.

In the conventional evaporation, each opening of the shadow mask corresponds to a position of one sub-pixel. Accordingly, the resolution of the conventional device is restricted by the processing ability of FMM.

When a display requiring high resolution is fabricated, accuracy of alignment system, tolerance of opening size, clogs and contamination at the openings of the shadow mask would cause considerable effects on the production quality since the size and pitch of pixels are decreased. Currently, the highest resolution of the commercial product, fabricated by aligning one opening of the shadow mask to one sub-pixel in the conventional evaporation, is about 300 PPI.

SUMMARY

The disclosure is directed to a display, particularly an organic electroluminescence display (OLED). A resolution of the OLED applied by the embodiment can be effectively increased, and the OLED of the embodiment can be manufactured under the current process ability of material deposition through shadow masks. According to the embodiment, an opening of a shadow mask is aligned correspondingly to three sub-pixels for deposition.

According to one embodiment, a display is provided, comprising a substrate, an electrode layer formed on the substrate and an organic material layer formed on the electrode layer. The electrode layer has an electrode pattern. A plurality of pixel units are configured by the organic material layer combined with the electrode pattern. At least one of pixel units comprises a plurality of different colored sub-pixels arranged in delta, and the same colored sub-pixels of adjacent pixel units are arranged in delta.

According to one embodiment, a display is provided, comprising a substrate, an electrode layer formed on the substrate and an organic material layer formed on the electrode layer. The electrode layer has an electrode pattern. A plurality of pixel units are configured by the organic material layer combined with the electrode pattern. At least one of pixel units comprises a plurality of different colored sub-pixels arranged in delta, and the same colored sub-pixels of adjacent pixel units are arranged in a strip. The pixel units are substantially arranged in a matrix, and the pixel units positioned in adjacent rows or in adjacent columns are in parallel to each other, and the pixel units positioned in adjacent columns have inverse shapes.

Figure 1C:
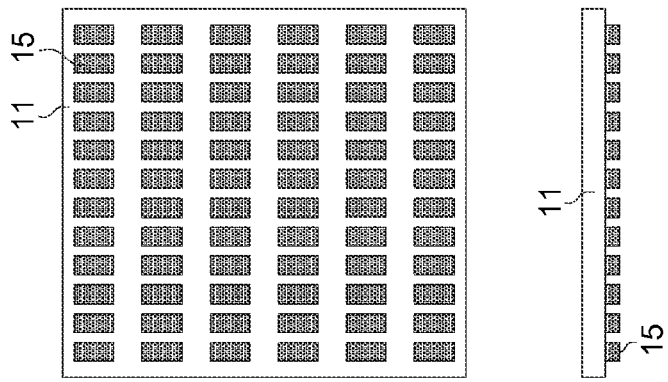
FIG. 1A~FIG. 1C illustrate an organic light emitting material evaporated in a vacuum system.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

The embodiment provides an organic electroluminescence display (OLED) fabricated under the current process ability of material deposition through shadow masks. According to the embodiment, an opening of a shadow mask is aligned correspondingly to three sub-pixels for deposition, thereby increasing the resolution of the OLED in application, and the resolution is even up to 400 PPI or more.

According to the OLEDs of the embodiments, at least one of plural pixel units comprises a plurality of (such as three) different colored sub-pixels (such as R,G, and B sub-pixels) arranged in delta. Three of the same colored sub-pixels of the adjacent pixel units, constituting a light emitting unit, are arranged in delta or in a strip. In one embodiment, three adjacent sub-pixels having the same color of light, arranged in delta or in a strip, are formed by deposited the corresponding light emitting material through the same opening of the shadow mask.

Embodiments are provided hereinafter with reference to the accompanying drawings for describing the related configurations, but the present disclosure is not limited thereto. The identical and/or similar elements of the embodiments are designated with the same and/or similar reference numerals. Also, it is noted that there may be other embodiments of the present disclosure which are not specifically illustrated. It is also important to point out that the illustrations may not be necessarily be drawn to scale. Thus, the specification and the drawings are to be regard as an illustrative sense rather than a restrictive sense.

First Embodiment

Figure 1B:
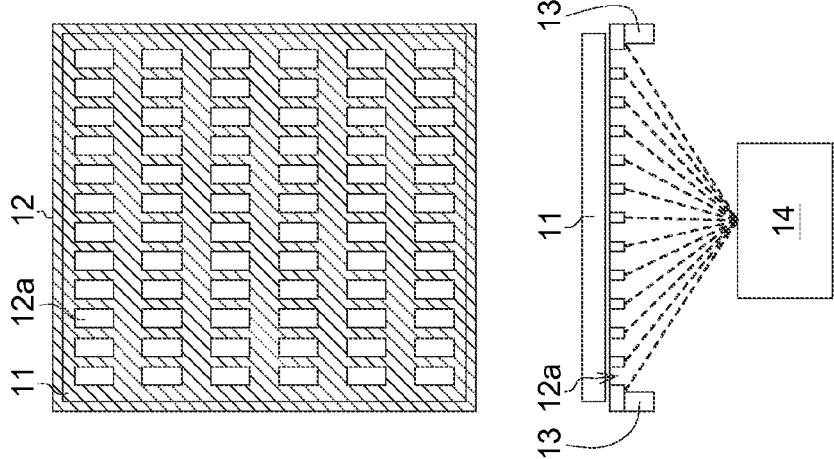
Figure 1A:
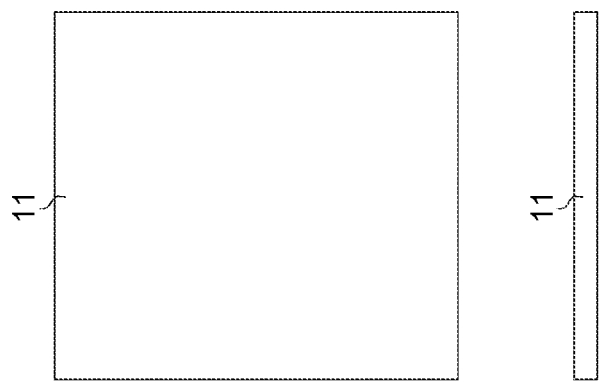
Figure 2A:
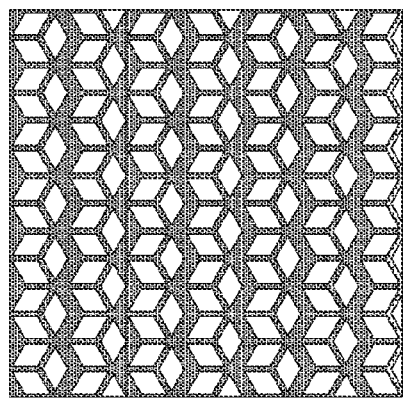
FIG. 2A is a top view of an electrode pattern of an electrode layer of an OLED according to the first embodiment of the disclosure.
Figure 2B:
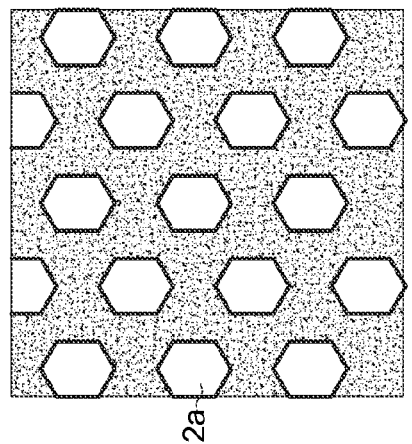
FIG. 2B is a top view of a shadow mask of an OLED according to the first embodiment of the disclosure.
Figure 3:
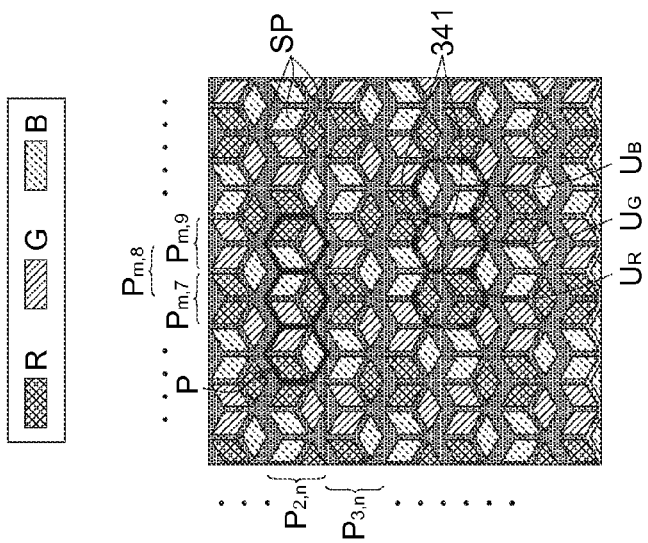
FIG. 3 is a top view of a pixel arrangement of an OLED according to the first embodiment of the disclosure.

FIG. 2A is a top view of an electrode pattern of an electrode layer of an OLED according to the first embodiment of the disclosure. FIG. 2B is a top view of a shadow mask of an OLED according to the first embodiment of the disclosure. FIG. 3 is a top view of a pixel arrangement of an OLED according to the first embodiment of the disclosure. Please also refer to FIG. 1A~FIG. 1C for the details of the vacuum evaporation through a shadow mask.

In the first embodiment, the OLED comprises an electrode layer having an electrode pattern 30 (FIG. 2A) formed on the substrate, and an organic material layer formed on the electrode layer. Combination of the organic material layer and the electrode pattern 30 creates a plurality of pixel units P. As shown in FIG. 3, if the configuration of FIG. 3 is divided according to the color of light, a plurality of light emitting units $U_R$, $U_G$, or $U_B$, each comprising the portions emitting the same color, can be determined. At least one of the pixel units P comprises several (such as three) different colored sub-pixels (ex: red sub-pixels, green sub-pixels and blue sub-pixels) arranged in delta, and the same colored sub-pixels of adjacent pixel units P are arranged in delta. As shown in FIG. 3, each of the light emitting units $U_R$, $U_G$, or $U_B$ includes several light emitting portions 341; for example, three light emitting portions 341 emitting the same color are positioned in a delta arrangement.

Figure 4A:
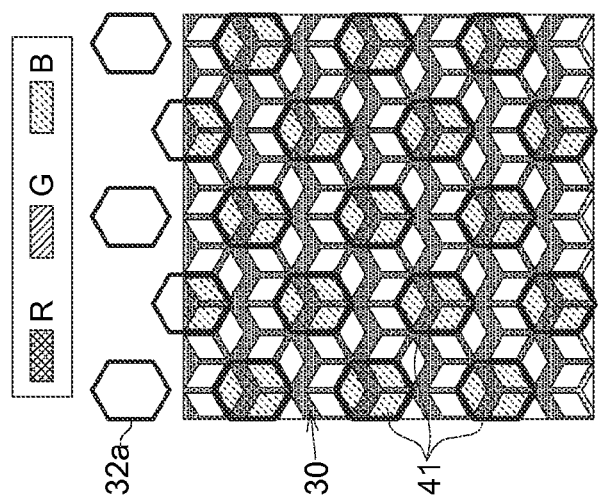
FIG. 4A~FIG. 4C illustrate the organic materials with different colors being deposited through the shadow mask of FIG. 2B according to the first embodiment of the disclosure.
Figure 4B:
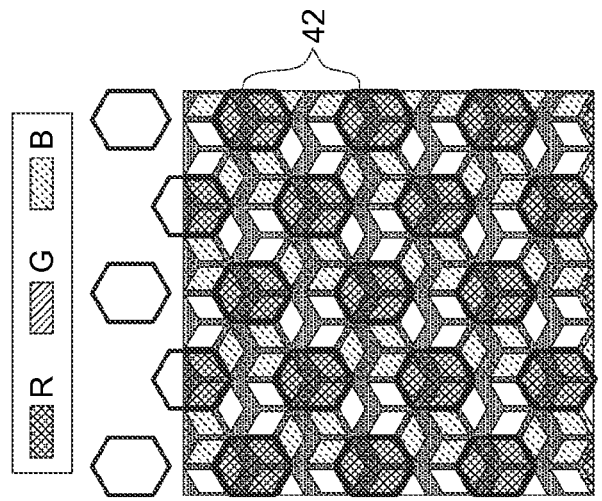
Figure 4C:
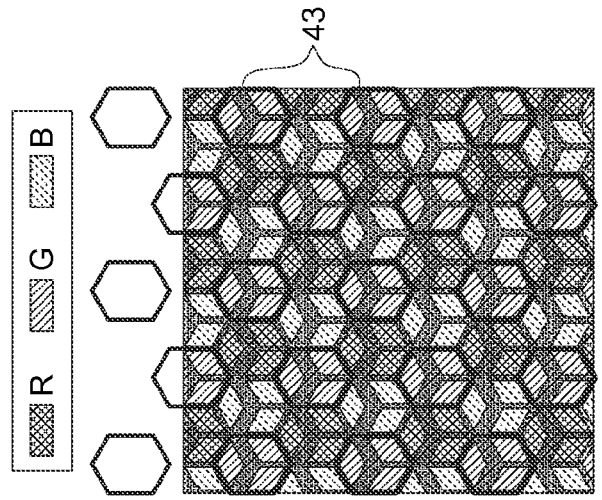

FIG. 4A~FIG. 4C illustrate the organic materials with different colors being deposited through the shadow mask of FIG. 2B according to the first embodiment of the disclosure. In one embodiment, the organic material layer includes different light emitting materials capable of emitting three different colors of light. As shown in FIG. 4A, a first light emitting material (such as the material emitting blue light) is deposited through the opening 32a of the shadow mask 32 to form a plurality of first light emitting material areas 41. Then, the shadow mask 32 or the substrate is shifted, and a second light emitting material (such as the material emitting red light) is deposited through the opening 32a of the shadow mask 32 to form a plurality of second light emitting material areas 42. The shadow mask 32 or the substrate is shifted again, and a third light emitting material (such as the material emitting green light) is deposited through the opening 32a of the shadow mask 32 to form a plurality of third light emitting material areas 43. In one embodiment, the first light emitting material emits the light (i.e. blue light) having the main peak of wavelengths in a range of about 380 nm to about 495 nm, the second light emitting material emits the light (i.e. red light) having the main peak of wavelengths in a range of about 580 nm to about 700 nm, and the third light emitting material emits the light (i.e. green light) having the main peak of wavelengths in a range of about 495 nm to about 590 nm, after a voltage is applied to the OLED. The electrode pattern 30 combined with the first light emitting material areas 41, second light emitting material areas 42 and the third light emitting material areas 43 create a plurality of the light emitting units having the first light color (such as the blue light emitting units $U_B$), a plurality of the light emitting units having the second light color (such as the red light emitting units $U_G$), a plurality of the light emitting units having the third light color (such as the green light emitting units $U_G$), respectively. According to the embodiment, each of the first light emitting material areas 41 corresponds to a continuous portion of the first light-emitting material, each of the second light emitting material areas 42 corresponds to a continuous portion of the second light-emitting material, and each of the third light emitting material areas 43 corresponds to a continuous portion of the third light-emitting material.

Please refer to FIG. 3 and FIG. 4A~FIG. 4C. Although the first light emitting material areas 41, the second light emitting material areas 42 and the third light emitting material areas 43 are illustrated to have substantially equal area, the disclosure is not limited thereto. The design and/or the manufacture of the embodiments could be slightly modified and changed in the different practical applications. For example, the blue light emitting units ($U_B$) may have the largest area, and the green light emitting units ($U_G$) may have the smallest area. In the evaporation process, different shadow masks can be applied for depositing the light emitting materials with three different colors of light, wherein the shadow mask for depositing the blue light emitting material may have the largest openings while another shadow mask for depositing the green light emitting material may have the smallest openings. Alternatively, another electrode pattern having different sizes can be applied to generate different areas of the light emitting units emitting different light colors.

Additionally, the pixel units P of the first embodiment are substantially arranged in a matrix, as shown in FIG. 3. For example, a matrix with m row and n column is illustrated in FIG. 3, wherein m and n are positive integers. The pixel units in the second row can be denoted as $P_{2,n}$, and the pixel units in the third row can be denoted as $P_{3,n}$, etc. The pixel units in the seventh column can be denoted as $P_{m,7}$, the pixel units in the eighth column can be denoted as $P_{m,8}$, and the pixel units in the ninth column can be denoted as $P_{m,9}$, etc. As shown in FIG. 3, the pixel units positioned in adjacent rows (such as the pixel units $P_{2,n}$ in the second row and the pixel units $P_{3,n}$ in the third row) are in parallel to each other. The pixel units positioned in adjacent columns (such as the pixel units $P_{m,7}$ in the seventh column and the pixel units $P_{m,8}$ in the eighth column, or the pixel units $P_{m,8}$ in the eighth column and the pixel units $P_{m,9}$ in the ninth column) are misaligned to each other, i.e. the pixel units $P_{m,8}$ is between the pixel units $P_{m,7}$ and the pixel units $P_{m,9}$.

In the first embodiment, the adjacent pixel units in the same row emit identical color of light. Also, as shown in FIG. 3, at least one colored sub-pixels (/light emitting portions 341) adjoin the adjacent pixel units in the same row. Take the pixel units in the second row for example, the pixel units $P_{2,7}$ in the seventh column and the pixel units $P_{2,9}$ in the ninth column are adjoined by the blue sub-pixels (/light emitting portions). Take the blue sub-pixels of the pixel units $P_{2,7}$, $P_{2,9}$ and $P_{1,8}$ for example, they are fabricated by simultaneously depositing the light emitting material emitting blue light through the same opening 32a of the shadow mask. Accordingly, for the pixel units in the same row, at least one colored light emitting material is continuous between the adjacent sub-pixels of the pixel units; for example, at least one of the blue light emitting units ($U_B$) is continuous between the adjacent sub-pixels of the pixel units $P_{2,7}$ and $P_{2,9}$, and is corresponding to the adjacent sub-pixels of the pixel units $P_{2,7}$ and $P_{2,9}$ simultaneously (i.e. the adjacent light emitting portions of the adjacent pixel units in the same row share a continuous portion of the light emitting material and the continuous portion of the light-emitting material is corresponding to more than one sub-pixel such as two adjacent sub-pixels).

In one embodiment, the electrode layer is an ITO layer patterned to form the electrode pattern 30 as shown in FIG. 2A. Although each of the first light emitting material areas 41/the second light emitting material areas 42/the third light emitting material areas 43 shares a continuous portion of the light-emitting material, the dark regions (no light emitted) exist due to the configuration of the electrode pattern 30. After the organic material layer is combined with the electrode pattern 30, the dark regions correspond to the regions of the electrode layer without ITO. According to the pixel arrangement shown in FIG. 3 and FIG. 5B, the same colored sub-pixels of the light emitting units $U_R/U_G/U_B$ are spaced apart by a distance ($G_S$), and the different colored sub-pixels (RGB) of each pixel unit are also spaced apart by a distance ($G_P$).

In one embodiment, for a light emitting unit $U_R/U_G/U_B$, the same colored sub-pixels (/light emitting portions 341) arranged in delta are spaced apart by a distance of $G_S$, which is less than a distance of $G_P$ formed between the different colored sub-pixels (RGB) of a pixel unit P.

According to the OLED disclosed in the embodiment, the resolution of the OLED can be effectively increased under the current process ability of material deposition through shadow masks. In one embodiment, the resolution of the OLED can be effectively increased up to 400 PPI by using a fine metal mask (FMM, shadow mask) with a resolution of 222 PPI. Please refer to FIG. 5A and FIG. 5B, respectively showing the sizes of one set of the shadow mask and the pixels of the first embodiment.

Figure 5B:
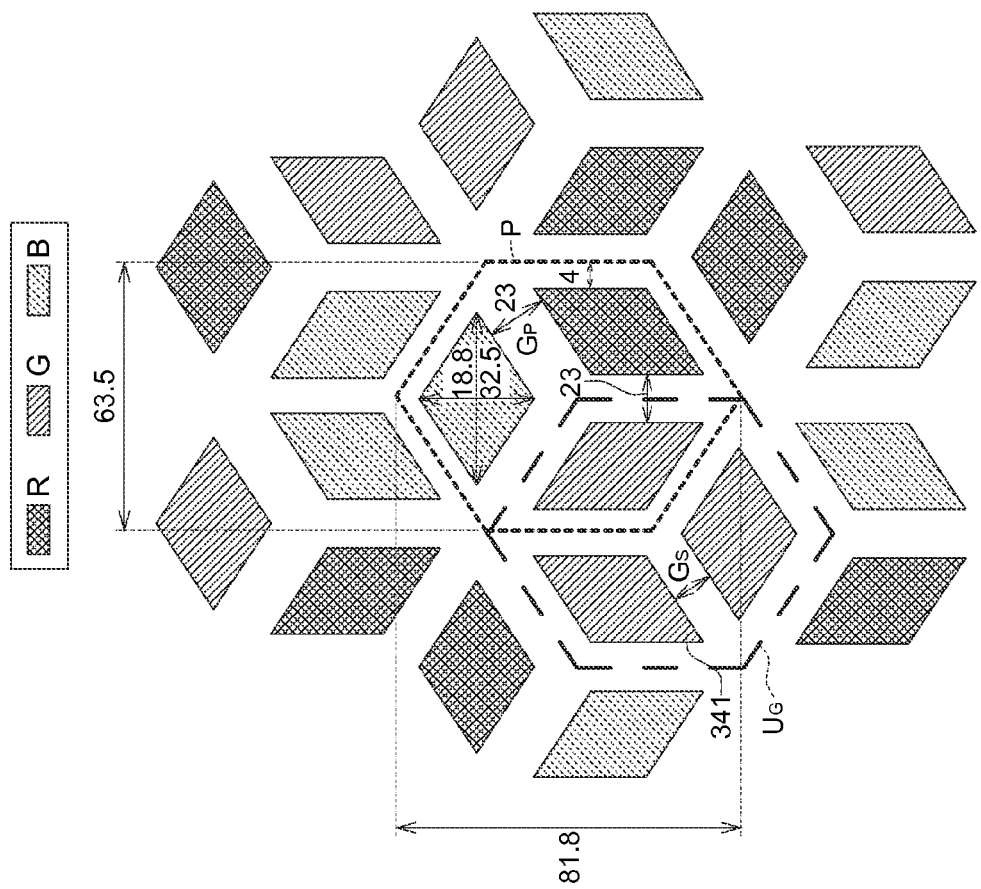
FIG. 5A and FIG. 5B show the sizes of one set of the shadow mask and the pixels of the first embodiment, respectively.
Figure 5A:
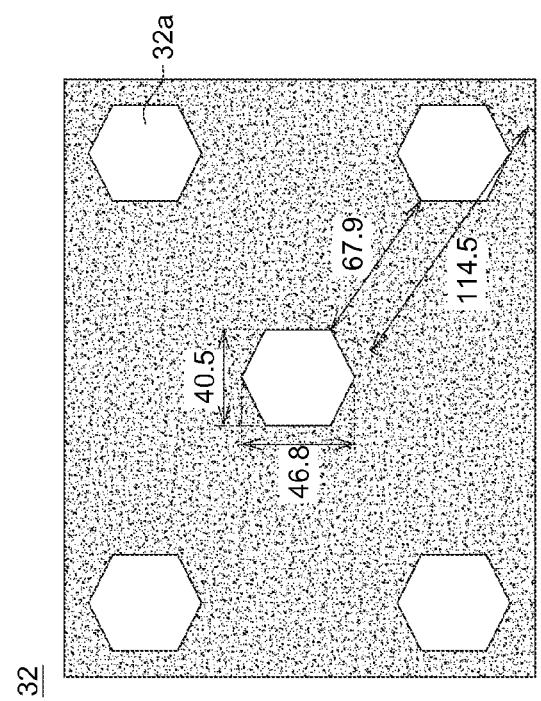

According to the current FMM process ability, (1) the evaporation accuracy is about ±12 μm, the total pitch is about ±7 μm, the open accuracy is about ±3 μmm; (2) the smallest opening is about 30 μm (in diameter), the opening pitch is about 20 μm; (3) the smallest slit is about 48 μm. As shown in the shadow mask 32 of FIG. 5A, the smallest distance is about 67.9 μm, the pitch is about 114.5 μm, and the opening 32a is about 46.8 μm in length and about 40.5 μm in width. The shadow mask 32 has a resolution of about 222 PPI merely. According to one of the embodiment, the pixel unit P manufactured by the shadow mask 32 is shown in FIG. 5B. The pixel unit P of FIG. 5B has a size of about 81.8 μm in length and about 63.5 μm in width. In this pixel unit P, the RGB sub-pixels are spaced apart from each other at about 23 μm (distance of $G_P$). For a light emitting unit constituted by three sub-pixels emitting the same color of light, such as the light emitting unit emitting green light $U_G$, while three light emitting portions 341 (/sub-pixels) are spaced apart from each other at about 8 μm (distance of $G_S$).

In the first embodiment, the electrode pattern 30 comprises quadrilateral/rhombus pattern (as depicted in FIG. 2A); however, the disclosure is not limited thereto. The geometric shape of the electrode pattern could be changed and modified according to the practical applications, such as a rounded form, a rectangular form or other regular polygons, so long as one opening of the shadow mask corresponding to three sub-pixels depositing the same colored material. More embodiments with various electrode patterns and pixel arrangements are described below. Moreover, evaporation process with the shadow mask for forming the light emitting materials is demonstrated in the embodiments, but the disclosure is not limited thereto. Other processes able to form the light emitting materials, such as ink jet printing, laser-induced Thermal Imaging or other suitable processes, can also be applied.

Second Embodiment

Figure 6:
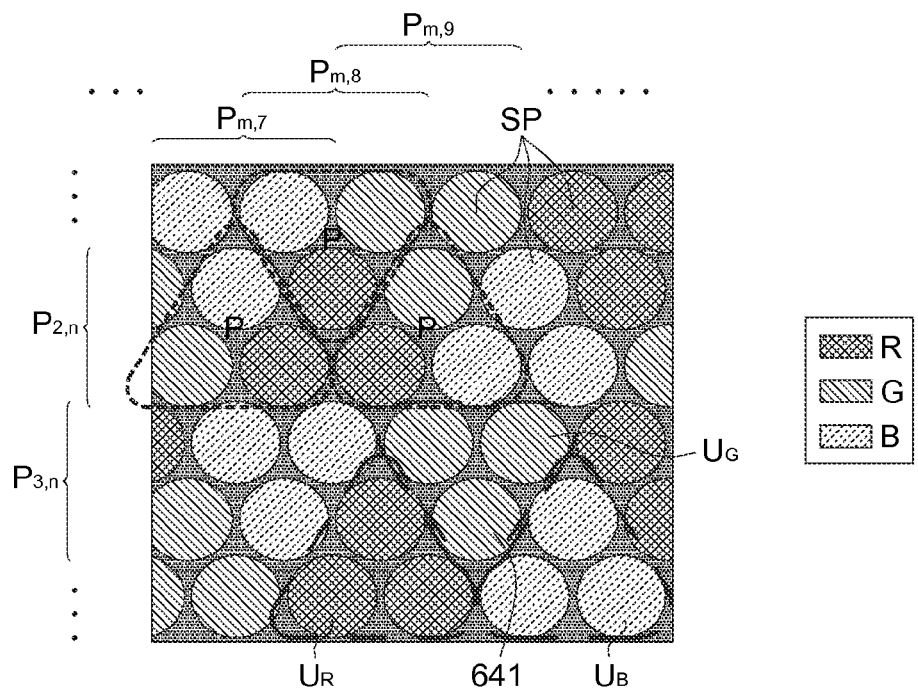
FIG. 6 is a top view of a pixel arrangement of an OLED according to the second embodiment of the disclosure.

FIG. 6 is a top view of a pixel arrangement of an OLED according to the second embodiment of the disclosure. In the second embodiment, an electrode layer has an electrode pattern with rounded shape. Please also refer to FIG. 2A, FIG. 2B, FIG. 3 and FIG. 4A~FIG. 4C for the details of the electrode pattern and shadow mask pattern, which are not redundantly repeated.

In the second embodiment, the OLED comprises an electrode layer having an electrode pattern formed on the substrate, and an organic material layer formed on the electrode layer. Combination of the organic material layer and the electrode pattern creates a plurality of pixel units P. As shown in FIG. 6, if the configuration of FIG. 6 is divided according to the color of light, a plurality of light emitting units $U_R$, $U_G$, or $U_B$, each comprising the portions emitting the same color, can be determined. At least one of the pixel units P comprises several (such as three) different colored sub-pixels (ex: red sub-pixels, green sub-pixels and blue sub-pixels) arranged in delta, and the same colored sub-pixels of adjacent pixel units P are arranged in delta. As shown in FIG. 6, each of the light emitting units $U_R$, $U_G$, or $U_B$ includes several light emitting portions 641; for example, three light emitting portions 641 emitting the same color are positioned in a delta arrangement.

Similar to the first embodiment, one shadow mask can be applied in the second embodiment for deposited the first light emitting material (such as the material emitting blue light), the second light emitting material (such as the material emitting red light), the third light emitting material (such as the material emitting green light) through the openings of the shadow mask, so as to form a plurality of light emitting material areas emitting different light colors in sequence. In one embodiment, the first light emitting material emits the light (i.e. blue light) having the main peak of wavelengths in a range of about 380 nm to about 495 nm, the second light emitting material emits the light (i.e. red light) having the main peak of wavelengths in a range of about 580 nm to about 700 nm, and the third light emitting material emits the light (i.e. green light) having the main peak of wavelengths in a range of about 495 nm to about 590 nm, after a voltage is applied to the OLED. The electrode pattern combined with the light emitting material areas emitting certain light color create a plurality of the light emitting units having certain light color. For example, the electrode pattern combined with the light emitting material areas emitting blue color creates a plurality of blue light emitting units $U_B$, the electrode pattern combined with the light emitting material areas emitting red color creates a plurality of red light emitting units $U_R$, and the electrode pattern combined with the light emitting material areas emitting green color creates a plurality of green light emitting units $U_G$.

Similar to the first embodiment, each of the blue, red or green light emitting material areas of the second embodiment has a continuous portion of the light-emitting materials emitting blue, red or green light, respectively, and the continuous portion of the light emitting materials are corresponding to more than one sub-pixel areas. As shown in FIG. 6, the size of the continuous portion of the light emitting materials, i.e. a light emitting unit $U_B/U_R/U_G$, corresponds to the size of a pixel unit P. However, the disclosure is not limited therein.

Additionally, the pixel units P of the second embodiment can be regarded as a matrix arrangement with m row and n column, as shown in FIG. 6, wherein m and n are positive integers. The pixel units in the second row and the third row can be respectively denoted as $P_{2,n}$ and $P_{3,n}$, etc. The pixel units in the seventh column, eighth column and ninth column can be respectively denoted as $P_{m,7}$, $P_{m,8}$ and $P_{m,9}$, etc. In the second embodiment, the pixel units positioned in adjacent rows (such as the pixel units $P_{2,n}$ in the second row and the pixel units $P_{3,n}$ in the third row) are in parallel to each other. Also, in the second embodiment, the pixel units positioned in adjacent columns (such as the pixel units $P_{m,7}$ in the seventh column and the pixel units $P_{m,8}$ in the eighth column) are misaligned to each other, i.e. the pixel units $P_{m,8}$ is between the pixel units $P_{m,7}$ and the pixel units $P_{m,9}$, and have inverse shapes (i.e. inverse triangle vs. triangle).

Moreover, for the pixel units of the second embodiment positioned in the same row, the adjacent sub-pixels emit identical color of light. As shown in FIG. 6, at least one colored sub-pixels (/light emitting portions) adjoin the adjacent pixel units in the same row. Take the pixel units in the second row for example, the adjacent pixel units $P_{2,7}$ and $P_{2,9}$ are adjoined by the red sub-pixels (/light emitting portions). Take the red sub-pixels of the pixel units $P_{2,7}$) $P_{2,9}$ and $P_{1,8}$ for example, they are fabricated by simultaneously depositing the light emitting material emitting red light through the same one of the openings of the shadow mask. According to the second embodiment, for the pixel units in the same row, at least one colored light emitting material is continuous between the adjacent sub-pixels of the pixel units; for example, at least one of the red light emitting units ($U_G$) is continuous between the adjacent sub-pixels of the pixel units $P_{2,7}$ and $P_{2,9}$) and is corresponding to the adjacent sub-pixels of the pixel units $P_{2,7}$ and $P_{2,9}$ simultaneously (i.e. the adjacent light emitting portions of the adjacent pixel units in the same row share a continuous portion of the light emitting material and the continuous portion of the light-emitting material is corresponding to more than one sub-pixel such as two adjacent sub-pixels).

According to the OLED fabricated by the second embodiment, the resolution of the OLED can be effectively increased, such as up to about 400 PPI, under the current process ability of material deposition through shadow masks.

Third Embodiment

Figure 7:
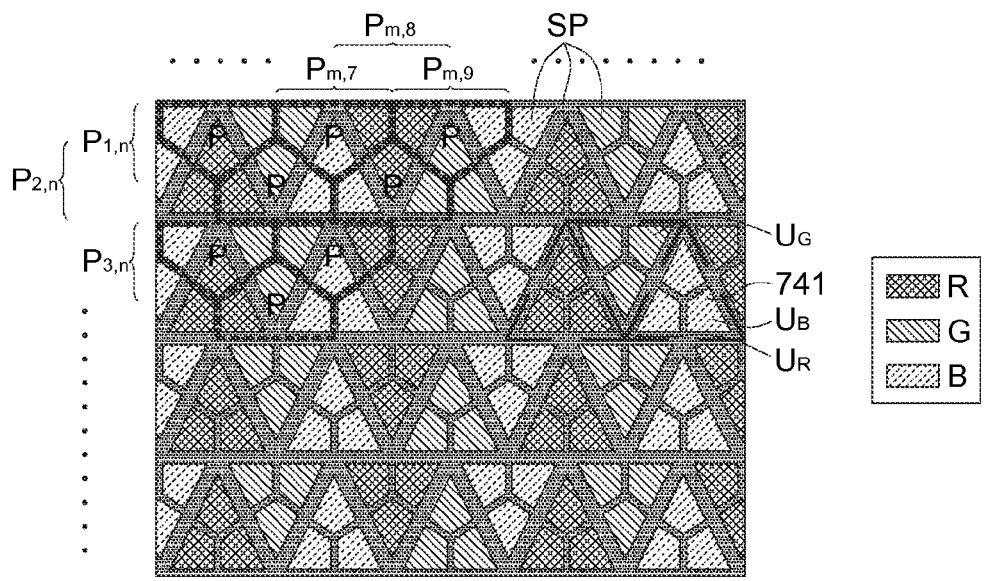
FIG. 7 is a top view of a pixel arrangement of an OLED according to the third embodiment of the disclosure.

FIG. 7 is a top view of a pixel arrangement of an OLED according to the third embodiment of the disclosure. In the third embodiment, an electrode layer has an electrode pattern with quadrilateral/rhombus shape, and the openings of the shadow mask are triangle shape, which generates the pixels with polygon shape after combination. Also, the acute angles of the electrode pattern could be rounded optionally.

In the third embodiment, the OLED comprises an electrode layer having an electrode pattern formed on the substrate, and an organic material layer formed on the electrode layer. Combination of the organic material layer and the electrode pattern creates a plurality of pixel units P. As shown in FIG. 7, if the configuration of FIG. 7 is divided according to the color of light, a plurality of light emitting units $U_R$, $U_G$, or $U_B$, each comprising the portions emitting the same color, can be determined. At least one of the pixel units P comprises several (such as three) different colored sub-pixels (ex: red sub-pixels, green sub-pixels and blue sub-pixels) arranged in delta, and the same colored sub-pixels of adjacent pixel units P are arranged in delta. As shown in FIG. 7, each of the light emitting units $U_R$, $U_G$, or $U_B$ includes three light emitting portions 741, and three light emitting portions 741 emitting the same color are also positioned in a delta arrangement.

Similar to the first embodiment, one shadow mask can be applied in the third embodiment for deposited the first light emitting material (such as the material emitting blue light), the second light emitting material (such as the material emitting red light), the third light emitting material (such as the material emitting green light) through the openings of the shadow mask, so as to form a plurality of light emitting material areas emitting different light colors. Noted that evaporation order of the light emitting materials can be altered. In one embodiment, the first light emitting material emits the light (i.e. blue light) having the main peak of wavelengths in a range of about 380 nm to about 495 nm, the second light emitting material emits the light (i.e. red light) having the main peak of wavelengths in a range of about 580 nm to about 700 nm, and the third light emitting material emits the light (i.e. green light) having the main peak of wavelengths in a range of about 495 nm to about 590 nm, after a voltage is applied to the OLED. Also, the electrode pattern combined with the light emitting material areas emitting blue color creates a plurality of blue light emitting units $U_B$, the electrode pattern combined with the light emitting material areas emitting red color creates a plurality of red light emitting units $U_R$, and the electrode pattern combined with the light emitting material areas emitting green color creates a plurality of green light emitting units $U_G$. Similarly, each of the blue, red or green light emitting material areas of the third embodiment shares a continuous portion of the light-emitting materials emitting blue, red or green light, respectively.

Additionally, the pixel units P of the third embodiment can be regarded as a matrix arrangement with m row and n column, as shown in FIG. 7, wherein m and n are positive integers. The pixel units in the second row and the third row can be respectively denoted as $P_{2,n}$ and $P_{3,n}$, etc. The pixel units in the seventh column, eighth column and ninth column can be respectively denoted as $P_{m,7}$, $P_{m,8}$ and $P_{m,9}$, etc. In the third embodiment, the pixel units in adjacent rows (such as the pixel units $P_{2,n}$ in the second row and the pixel units $P_{3,n}$ in the third row) are disposed in parallel. Also, in the third embodiment, the pixel units positioned in adjacent columns (such as the pixel units $P_{m,7}$ in the seventh column and the pixel units $P_{m,8}$ in the eighth column) are misaligned to each other, i.e. the pixel units $P_{m,8}$ is between the pixel units $P_{m,7}$ and the pixel units $P_{m,9}$, and have inverse shapes.

Moreover, for the pixel units positioned in the same row according to the third embodiment, the adjacent sub-pixels emit identical color of light. As shown in FIG. 7, at least one colored sub-pixels (/light emitting portions) adjoin the adjacent pixel units in the same row. Take the pixel units in the first row for example, the adjacent pixel units $P_{1,7}$ and $P_{1,9}$ are adjoined by the red sub-pixels (/light emitting portions). Take the red sub-pixels of the pixel units $P_{1,7}$, $P_{1,9}$ and $P_{2,8}$ for example, they are fabricated by simultaneously depositing the light emitting material emitting red light through the same one of the triangle openings of the shadow mask. According to the third embodiment, for the pixel units in the same row, at least one colored light emitting material is continuous between the adjacent sub-pixels of the pixel units; for example, at least one of the red light emitting units ($U_G$) is continuous between the adjacent sub-pixels of the pixel units $P_{1,7}$ and $P_{1,9}$ and is corresponding to the adjacent sub-pixels of the pixel units $P_{1,7}$ and $P_{1,9}$ simultaneously (i.e. the adjacent light emitting portions of the adjacent pixel units in the same row share a continuous portion of the light emitting material, and the continuous portion of the light-emitting material is corresponding to more than one sub-pixel such as two adjacent sub-pixels).

According to the OLED fabricated by the third embodiment, the resolution of the OLED can be effectively increased, such as up to about 400 PPI, under the current process ability of material deposition through shadow masks.

Fourth Embodiment

Figure 8:
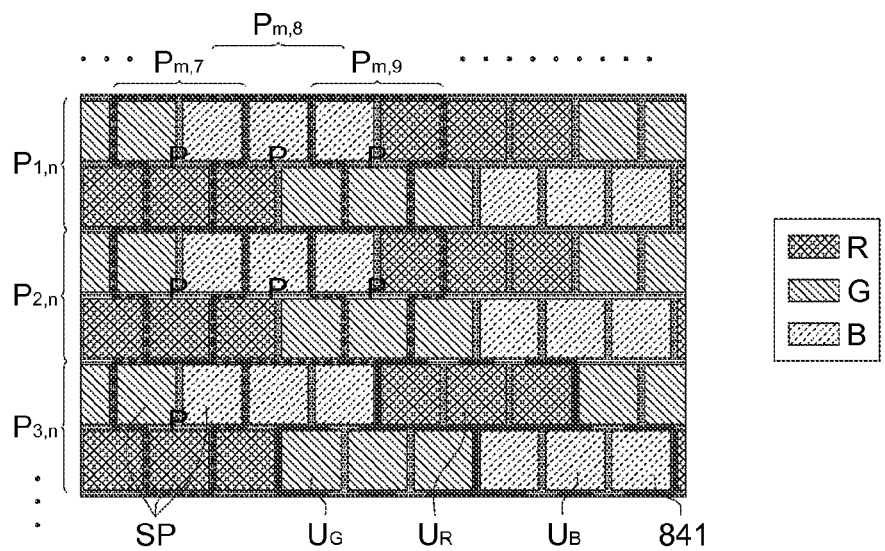
FIG. 8 is a top view of a pixel arrangement of an OLED according to the fourth embodiment of the disclosure.

FIG. 8 is a top view of a pixel arrangement of an OLED according to the fourth embodiment of the disclosure. In the third embodiment, an electrode layer has an electrode pattern with rectangular shape (i.e. square), and the openings of the shadow mask are rectangular (wherein the size of each opening corresponds to three sub-pixels arranged as a strip), which generates the pixels with polygon shape (one square sub-pixel at the lateral side of two square sub-pixels) after combination. Also, the acute angles of the electrode pattern could be rounded optionally.

In the fourth embodiment, the OLED comprises an electrode layer having an electrode pattern formed on the substrate, and an organic material layer formed on the electrode layer. Combination of the organic material layer and the electrode pattern creates a plurality of pixel units P. As shown in FIG. 8, if the configuration of FIG. 8 is divided according to the color of light, a plurality of light emitting units $U_R$, $U_G$, or $U_B$, each comprising the portions emitting the same color, can be determined. At least one of the pixel units P comprises several (such as three) different colored sub-pixels (ex: red sub-pixels, green sub-pixels and blue sub-pixels) arranged in delta, and the same colored sub-pixels of adjacent pixel units P are arranged in a strip. As shown in FIG. 8, each of the light emitting units $U_R$, $U_G$, or $U_B$ includes several light emitting portions 841. In the fourth embodiment, each of the light emitting units $U_R$, $U_G$, or $U_B$ includes three light emitting portions 841 aligned as a strip.

Similar to the first embodiment, one shadow mask can be applied in the fourth embodiment for deposited the first light emitting material (such as the material emitting blue light), the second light emitting material (such as the material emitting red light), the third light emitting material (such as the material emitting green light) through the openings of the shadow mask, so as to form a plurality of light emitting material areas emitting different light colors. Noted that evaporation order of the light emitting materials can be altered. In one embodiment, the first light emitting material emits the light (i.e. blue light) having the main peak of wavelengths in a range of about 380 nm to about 495 nm, the second light emitting material emits the light (i.e. red light) having the main peak of wavelengths in a range of about 580 nm to about 700 nm, and the third light emitting material emits the light (i.e. green light) having the main peak of wavelengths in a range of about 495 nm to about 590 nm, after a voltage is applied to the OLED. Also, the electrode pattern combined with the light emitting material areas emitting blue color creates a plurality of blue light emitting units $U_B$, the electrode pattern combined with the light emitting material areas emitting red color creates a plurality of red light emitting units $U_R$, and the electrode pattern combined with the light emitting material areas emitting green color creates a plurality of green light emitting units $U_G$. Similarly, each of the blue, red or green light emitting material areas of the fourth embodiment shares a continuous portion of the light-emitting materials emitting blue, red or green light, respectively.

Additionally, the pixel units P of the fourth embodiment can be regarded as a matrix arrangement with m row and n column, as shown in FIG. 8, wherein m and n are positive integers. The pixel units in the second row and the third row can be respectively denoted as $P_{2,n}$ and $P_{3,n}$, etc. The pixel units in the seventh column, eighth column and ninth column can be respectively denoted as $P_{m,7}$, $P_{m,8}$ and $P_{m,9}$, etc. In the fourth embodiment, the pixel units in adjacent rows (such as the pixel units $P_{2,n}$ in the second row and the pixel units $P_{3,n}$ in the third row) are disposed in parallel. Also, in the fourth embodiment, the pixel units positioned in adjacent columns (such as the pixel units $P_{m,7}$ and $P_{m,8}$) are misaligned to each other, i.e. the pixel units $P_{m,8}$ is between the pixel units $P_{m,7}$ and the pixel units $P_{m,9}$, and have inverse shapes.

Moreover, for the pixel units positioned in the same row according to the fourth embodiment, two different colored sub-pixels (/light emitting portions) adjoin the adjacent sub-pixels. Take the pixel units in the second row for example, the adjacent pixel units $P_{2,7}$ and $P_{2,8}$ are adjoined by the red and blue sub-pixels (/light emitting portions), as shown in FIG. 8. Additionally, the blue sub-pixels of the pixel units $P_{2,7}$, $P_{2,8}$ and $P_{2,9}$ are formed by simultaneously depositing the blue colored light emitting material through a strip-shaped opening. The red sub-pixels of the pixel units $P_{2,7}$, $P_{2,8}$ and $P_{2,9}$ are formed by simultaneously depositing the red colored light emitting material through a strip-shaped opening. According to the fourth embodiment, for the pixel units in the same row, two different colored light emitting materials are continuous between the adjacent sub-pixels of the pixel units (i.e. the adjacent sub-pixels (/light emitting portions) of the adjacent pixel units in the same row share a continuous portion of the light emitting material). Also, the continuous portion of one light-emitting material in the fourth embodiment is corresponding to three sub-pixels in a row.

According to the OLED fabricated by the fourth embodiment, the resolution of the OLED can be effectively increased, such as up to about 400 PPI, under the current process ability of material deposition through shadow masks.

Fifth Embodiment

Figure 9:
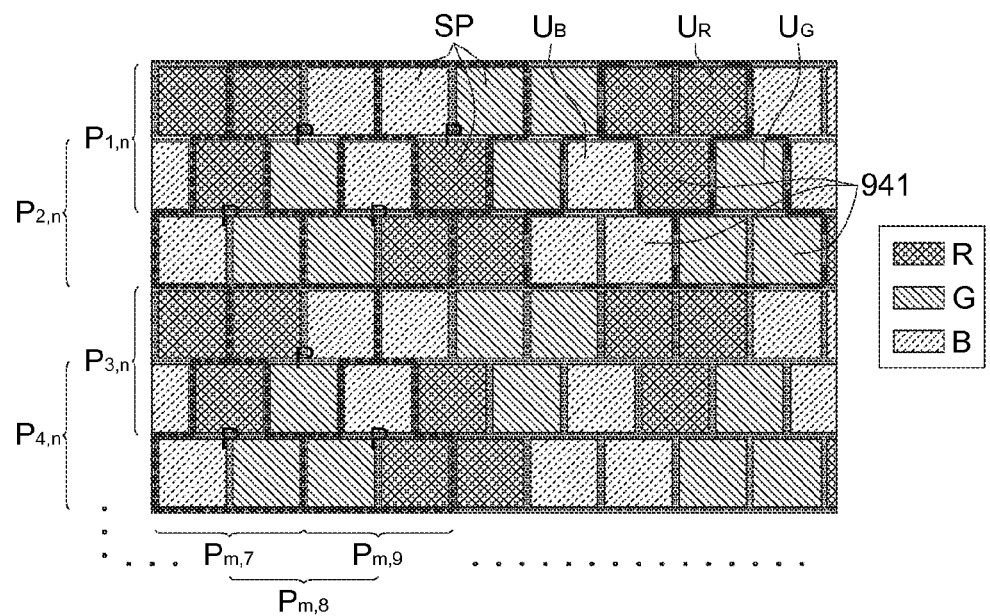
FIG. 9 is a top view of a pixel arrangement of an OLED according to the fifth embodiment of the disclosure.

FIG. 9 is a top view of a pixel arrangement of an OLED according to the fifth embodiment of the disclosure. In the fifth embodiment, an electrode layer has an electrode pattern with rectangular shape (i.e. square), and each pixel is polygon shape (one square sub-pixel at the lateral side of two square sub-pixels). The shape of an opening of the shadow mask corresponds to the shape of the pixel. Also, the acute angles of the electrode pattern could be rounded optionally.

In the fifth embodiment, the OLED comprises an electrode layer having an electrode pattern formed on the substrate, and an organic material layer formed on the electrode layer. Combination of the organic material layer and the electrode pattern creates a plurality of pixel units P. As shown in FIG. 9, if the configuration of FIG. 9 is divided according to the color of light, a plurality of light emitting units $U_R$, $U_G$, or $U_B$, each comprising the portions emitting the same color, can be determined. At least one of the pixel units P comprises several (such as three) different colored sub-pixels (ex: red sub-pixels, green sub-pixels and blue sub-pixels) arranged in delta, and the same colored sub-pixels of adjacent pixel units P are arranged in delta. As shown in FIG. 9, each of the light emitting units $U_R$, $U_G$, or $U_B$ includes several light emitting portions 941 (/sub-pixels) emitting the same color; for example, three light emitting portions 941 of each light emitting unit are arranged in delta.

Similar to the first embodiment, one shadow mask can be applied in the fifth embodiment for deposited the first light emitting material (such as the material emitting blue light), the second light emitting material (such as the material emitting red light), the third light emitting material (such as the material emitting green light) through the openings of the shadow mask, so as to form a plurality of light emitting material areas emitting different light colors. Noted that evaporation order of the light emitting materials can be altered. In one embodiment, the first light emitting material emits the light (i.e. blue light) having the main peak of wavelengths in a range of about 380 nm to about 495 nm, the second light emitting material emits the light (i.e. red light) having the main peak of wavelengths in a range of about 580 nm to about 700 nm, and the third light emitting material emits the light (i.e. green light) having the main peak of wavelengths in a range of about 495 nm to about 590 nm, after a voltage is applied to the OLED. Also, the electrode pattern combined with the light emitting material areas emitting blue color creates a plurality of blue light emitting units $U_B$, the electrode pattern combined with the light emitting material areas emitting red color creates a plurality of red light emitting units $U_R$, and the electrode pattern combined with the light emitting material areas emitting green color creates a plurality of green light emitting units $U_G$. Similarly, each of the blue, red or green light emitting material areas of the fifth embodiment shares a continuous portion of the light-emitting materials emitting blue, red or green light, respectively.

Additionally, the pixel units P of the fifth embodiment can be regarded as a matrix arrangement with m row and n column, as shown in FIG. 9, wherein m and n are positive integers. The pixel units in the second row and the third row can be respectively denoted as $P_{2,n}$ and $P_{3,n}$, etc. The pixel units in the seventh column, eighth column and ninth column can be respectively denoted as $P_{m,7}$, $P_{m,8}$ and $P_{m,9}$, etc. In the fifth embodiment, the pixel units in adjacent rows (such as the pixel units $P_{2,n}$ in the second row and the pixel units $P_{3,n}$ in the third row) are disposed in parallel. Also, in the fifth embodiment, the pixel units positioned in adjacent columns (such as the pixel units $P_{m,7}$ and $P_{m,8}$) are misaligned to each other, i.e. the pixel units $P_{m,8}$ is between the pixel units $P_{m,7}$ and the pixel units $P_{m,9}$, and have inverse shapes.

Moreover, for the pixel units positioned in the same row according to the fifth embodiment, one colored sub-pixels (/light emitting portions) adjoin the adjacent sub-pixels. Take the pixel units in the second row for example, the adjacent pixel units $P_{2,7}$ and $P_{2,9}$ are adjoined by the green sub-pixels (/light emitting portions), as shown in FIG. 9, The green sub-pixels of the pixel units $P_{2,7}$, $P_{1,8}$ and $P_{2,9}$ are formed by simultaneously depositing the green colored light emitting material through an opening of the shadow mask. According to the fifth embodiment, for the pixel units in the same row, one colored light emitting material is continuous between the adjacent sub-pixels of the pixel units; for example, at least one of the green light emitting units ($U_B$) is continuous between the adjacent sub-pixels of the pixel units $P_{2,7}$ and $P_{2,9}$ and is corresponding to the adjacent sub-pixels of the pixel units $P_{2,7}$ and $P_{2,9}$ simultaneously (i.e. the adjacent light emitting portions of the adjacent pixel units in the same row share a continuous portion of the light emitting material and the continuous portion of the light-emitting material is corresponding to more than one sub-pixel such as two adjacent sub-pixels).

According to the OLED fabricated by the fifth embodiment, the resolution of the OLED can be effectively increased, such as up to about 400 PPI, under the current process ability of material deposition through shadow masks.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A display, comprising:
    a substrate;
    an electrode layer, formed on the substrate and having an electrode pattern;
    an organic material layer formed on the electrode layer, wherein a plurality of pixel units are configured by the organic material layer combined with the electrode pattern, and at least one of the plurality of pixel units comprises a plurality of different colored sub-pixels arranged in delta, and the same colored sub-pixels of adjacent pixel units are arranged in delta, wherein the same colored sub-pixels of adjacent pixel units share and correspond to a continuous portion of a light-emitting material.

2. The display according to claim 1, wherein the pixel units are substantially arranged in a matrix, and the pixel units positioned in adjacent rows are in parallel to each other.

3. The display according to claim 2, wherein the pixel units positioned in adjacent columns are misaligned to each other.

4. The display according to claim 2, wherein the pixel units positioned in adjacent columns have inverse shapes.

5. The display according to claim 1, wherein a distance of $G_S$ is formed between the same colored sub-pixels of adjacent pixel units while a distance of $G_P$ is formed between the different colored sub-pixels of adjacent pixel units, and the distance of $G_S$ is less than the distance of $G_P$.

6. The display according to claim 1, wherein the different colored sub-pixels emit lights having different main peaks of wavelengths in a range of about 380 nm to about 495 nm, a range of about 580 nm to about 700 nm, a range of about 495 nm to about 590 nm, respectively.

7. The display according to claim 6, wherein the sub-pixels which emit light having the wavelength with the main peak in a range of about 380 nm to about 495 nm have the largest areas.

8. The display according to claim 6, wherein the sub-pixels which emit light having the wavelength with the main peak in a range of about 495 nm to about 590 nm have the smallest areas.

9. A display, comprising:
a substrate;
an electrode layer, formed on the substrate and having an electrode pattern;
an organic material layer formed on the electrode layer, wherein a plurality of pixel units are configured by the organic material layer combined with the electrode pattern, and at least one of the plurality of pixel units comprises a plurality of different colored sub-pixels arranged in delta, and the same colored sub-pixels of adjacent pixel units are arranged in a strip, wherein the pixel units are substantially arranged in a matrix, and the pixel units positioned in adjacent rows or in adjacent columns are in parallel to each other, and the pixel units positioned in the adjacent columns have inverse shapes, wherein the same colored sub-pixels of adjacent pixel units share and correspond to a continuous portion of a light-emitting material.

10. The display according to claim 9, wherein the adjacent sub-pixels of the adjacent pixel units in the same row emit the same color of light.

11. The display according to claim 9, wherein the adjacent sub-pixels of the adjacent pixel units in the same row correspond to a continuous portion of a light-emitting material.

12. The display according to claim 1, wherein the continuous portion of the light-emitting material layer shared by the same colored sub-pixels of the adjacent pixel units is positioned correspondingly to a region enclosing three of the adjacent sub-pixels.

* * * * *